United States Patent
Radi et al.

(10) Patent No.: US 9,462,699 B2
(45) Date of Patent: Oct. 4, 2016

(54) METHOD OF FORMING METALLIC PATTERN ON POLYMER SUBSTRATE

(71) Applicant: Wistron NeWeb Corp., Hsinchu (TW)

(72) Inventors: Babak Radi, Hsinchu (TW); Yu-Fu Kuo, Hsinchu (TW)

(73) Assignee: Wistron NeWeb Corp., Hsinchu (TW)

( * ) Notice: Subject to any disclaimer, the term of this patent is extended or adjusted under 35 U.S.C. 154(b) by 263 days.

(21) Appl. No.: 14/304,982

(22) Filed: Jun. 16, 2014

(65) Prior Publication Data

US 2015/0366072 A1  Dec. 17, 2015

(51) Int. Cl.
  *H05K 3/02* (2006.01)
  *H05K 3/10* (2006.01)
  *H05K 3/18* (2006.01)
  *H04M 1/02* (2006.01)
  *H05K 1/02* (2006.01)
  (Continued)

(52) U.S. Cl.
  CPC .............. *H05K 3/185* (2013.01); *H05K 1/023* (2013.01); *H04M 1/0277* (2013.01); *H05K 1/0215* (2013.01); *H05K 1/0284* (2013.01); *H05K 1/034* (2013.01); *H05K 1/0326* (2013.01); *H05K 1/0346* (2013.01); *H05K 1/165* (2013.01); *H05K 3/0014* (2013.01); *H05K 3/105* (2013.01); *H05K 2201/015* (2013.01); *H05K 2201/0141* (2013.01); *H05K 2201/0145* (2013.01); *H05K2201/083* (2013.01); *H05K 2201/09118* (2013.01); *H05K 2201/10098* (2013.01); *Y10T 29/49156* (2015.01)

(58) Field of Classification Search
  CPC .......... C23C 18/1208; C23C 18/1612; C23C 18/1868; C23C 18/204; Y10T 428/2982; B01J 35/0013; B22F 1/0018; H05K 2203/072; H05K 2203/0723; H01L 51/0009

USPC .............. 29/846, 825, 829, 847, 848, 851; 427/97.4, 554, 559; 430/313, 315, 945, 430/195; 438/479
  See application file for complete search history.

(56) References Cited

U.S. PATENT DOCUMENTS 6,348,295 B1 * 2/2002 Griffith .............. B81C 1/00373
                                                257/E21.174
2006/0057502 A1 * 3/2006 Okada .................... C23C 18/14
                                                430/313

(Continued)

FOREIGN PATENT DOCUMENTS

DE     102012100299      7/2013
EP       1626106         2/2006
(Continued)

OTHER PUBLICATIONS

Michael Zenou et al., "Laser sintering of copper nanoparticles", Journal of Physics D: Applied Physics, Dec. 11, 2013, pp. 1-11.
(Continued)

*Primary Examiner* — Thiem Phan
(74) *Attorney, Agent, or Firm* — Jianq Chyun IP Office

(57) ABSTRACT

A method of forming a metallic pattern on a polymer substrate is provided. A mixture layer is formed on a polymer substrate surface. The mixture layer includes an active carrier medium and nanoparticles dispersed in the active carrier medium. A laser process is performed to treat a portion of the mixture layer to form active seed residues on the surface of the polymer substrate. A cleaning process is performed to remove an untreated portion of the mixture layer to expose the surface of the polymer substrate, while the active seed residues are remained on the surface of the polymer substrate. Then, the active seed residues on the polymer substrate are subjected to an electroless plating process to form the metallic pattern over the active seed residues on the polymer substrate.

9 Claims, 3 Drawing Sheets

(51) Int. Cl.
  *H05K 1/16* (2006.01)
  *H05K 3/00* (2006.01)
  *H05K 1/03* (2006.01)

(56) References Cited

U.S. PATENT DOCUMENTS

2009/0291230 A1* 11/2009 Lin .................. C09D 11/102
  427/553
2012/0074094 A1* 3/2012 Chiang ............... H01L 21/4846
  216/18

FOREIGN PATENT DOCUMENTS

TW   201215267   4/2012
WO   2014009927  1/2014

OTHER PUBLICATIONS

"Search Report of European Counterpart Application", issued on Nov. 19, 2015, p. 1-p. 9.
"Office Action of Taiwan Counterpart Application", issued on Dec. 28, 2015, p. 1-p. 10.

* cited by examiner

METHOD OF FORMING METALLIC PATTERN ON POLYMER SUBSTRATE

BACKGROUND OF THE INVENTION

1. Field of the Invention

The present invention generally relates to a process, in particular, to a method of forming a metallic pattern on a polymer substrate.

2. Description of Related Art

As technology advances, portable electronic devices, such as smart phones, tablet PCs, notebook PCs, etc., becomes more compact and lighter for easy carrying. For the purpose of miniaturization, the portable electronic device may be incorporated complicated circuitry as well as antenna formed by the LDS (laser direct structuring) technology, for compactness and efficiency. However, special LDS materials and specialized instruments required for the LDS technology lead to high production costs.

SUMMARY OF THE INVENTION

Accordingly, the present invention is directed to a manufacturing method of a metallic pattern over a polymer substrate, which offers high quality products with lower production costs.

The present invention provides a method of forming a metallic pattern on a polymer substrate. After a polymer substrate is provided, a mixture layer is formed on a surface of the polymer substrate. The mixture layer includes an active carrier medium and nanoparticles dispersed in the active carrier medium. A laser process is performed to treat a portion of the mixture layer to form active seed residues on the surface of the polymer substrate. A cleaning process is performed to remove an untreated portion of the mixture layer to expose the surface of the polymer substrate, while the active seed residues are remained on the surface of the polymer substrate. Then, the active seed residues on the polymer substrate are subjected to an electroless plating process to form the metallic pattern over the active seed residues on the polymer substrate.

According to an embodiment of the invention, a material of the polymer substrate includes nylons, polycarbonates (PC), acrylonitrile butadiene styrene (ABS), PC/ABS, polyethylene terephthalate (PET), polyether ether ketone (PEEK) or liquid crystal polymers (LCP).

According to an embodiment of the invention, a material of the nanoparticles includes copper oxide, copper, silver or gold.

According to an embodiment of the invention, a material of the nanoparticles includes copper oxide. The laser process is performed by using a UV laser at 355 nm with a power of 0.2~0.4 W and 80% overlapping and the laser process is a laser ablation and activation process. The active seed residues are copper residues. Alternatively, a material of the nanoparticles includes silver. The laser process is performed by using a green light laser at 532 nm or an IR laser at 1064 nm.

According to an embodiment of the invention, the electroless plating process includes an electroless copper plating process and the metallic pattern includes a copper pattern.

According to an embodiment of the invention, the nanoparticles have an average size below 100 nm.

According to an embodiment of the invention, a content of the nanoparticles in the mixture layer ranges from 10 wt % to 20 wt %, relative to a total weight of the mixture layer.

According to an embodiment of the invention, a material of the active carrier medium includes polyvinylpyrrolidone (PVP) or polyethylene oxide (PEO).

According to an embodiment of the invention, the step of forming the mixture layer includes forming the mixture layer by spraying, spin coating, dip coating, screen printing, pad printing or smearing.

According to an embodiment of the invention, a position of a distribution range of the active seed residues corresponds to a position of the metallic pattern.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
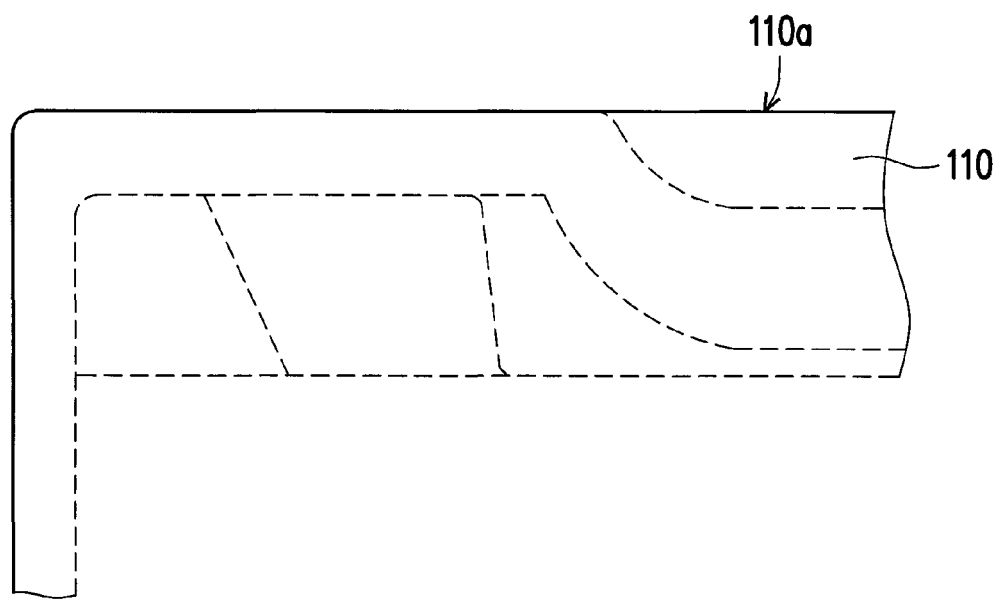
FIGS. 1-5 schematically illustrate a method of forming a metallic pattern on a polymer substrate according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts. In the following embodiment, a circuit trace part of a portable device is described as an example for illustration. It is not intended to limit the method or the part structure by the exemplary embodiments described herein.

FIGS. 1-5 schematically illustrate a method of forming a metallic pattern on a polymer substrate according to an embodiment of the present invention. Referring to FIG. 1, a polymer substrate 110 is provided. The polymer substrate 110 may be a polymer film, a casing body or even a circuit board, and may be made of a polymer material by injection molding technology. The polymer material may be nylons, polycarbonates (PC), acrylonitrile butadiene styrene (ABS), PC/ABS, polyethylene terephthalate (PET), polyether ether ketone (PEEK), liquid crystal polymers (LCP) or any suitable plastic material(s). The polymer substrate 110 needs not to be made of LDS-specific polymers (i.e. the polymer materials specifically designed for the laser direct structuring (LDS) process). The polymer substrate 110 may be a part or parts of an electronic device, and the electronic device may be, for example, a smart phone or a tablet PC, and the metallic pattern may be an antenna part or a three-dimensional circuit incorporated within the electronic device.

Figure 2:
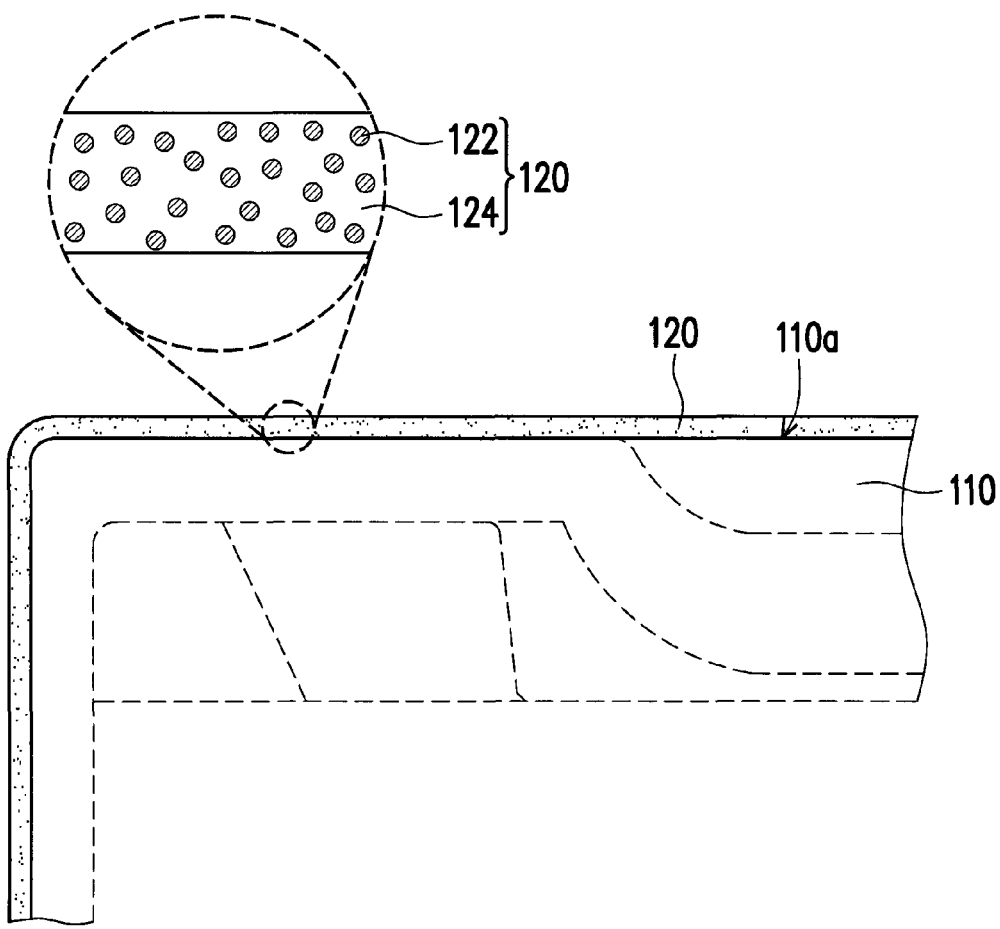

Subsequently, referring to FIG. 2, a mixture layer 120 is formed on the surface 110a of the polymer substrate 110 by spraying, spin coating, dip coating, screen printing, pad printing or smearing, for example. The mixture layer 120 includes at least nanoparticles 122 and an active carrier medium 124. The nanoparticles 122 may be metallic nanoparticles made of copper oxide, or metal nanoparticles made of copper, silver or gold, for example. Preferably, the nanoparticles 122 may be copper oxide nanoparticles, for example. The nanoparticles may have an average size below 100 nm, for example. The content of the nanoparticles 122 of the mixture layer 120 may be 10 wt %~20 wt %, relative to the total weight of the mixture layer 120. The material of the active carrier medium 124 may be polyvinylpyrrolidone (PVP), polyethylene oxide (PEO) and the like. In general, the active carrier medium 124 may be removed in the subsequent process by solvent washing and laser treatment, for example.

Figure 3:
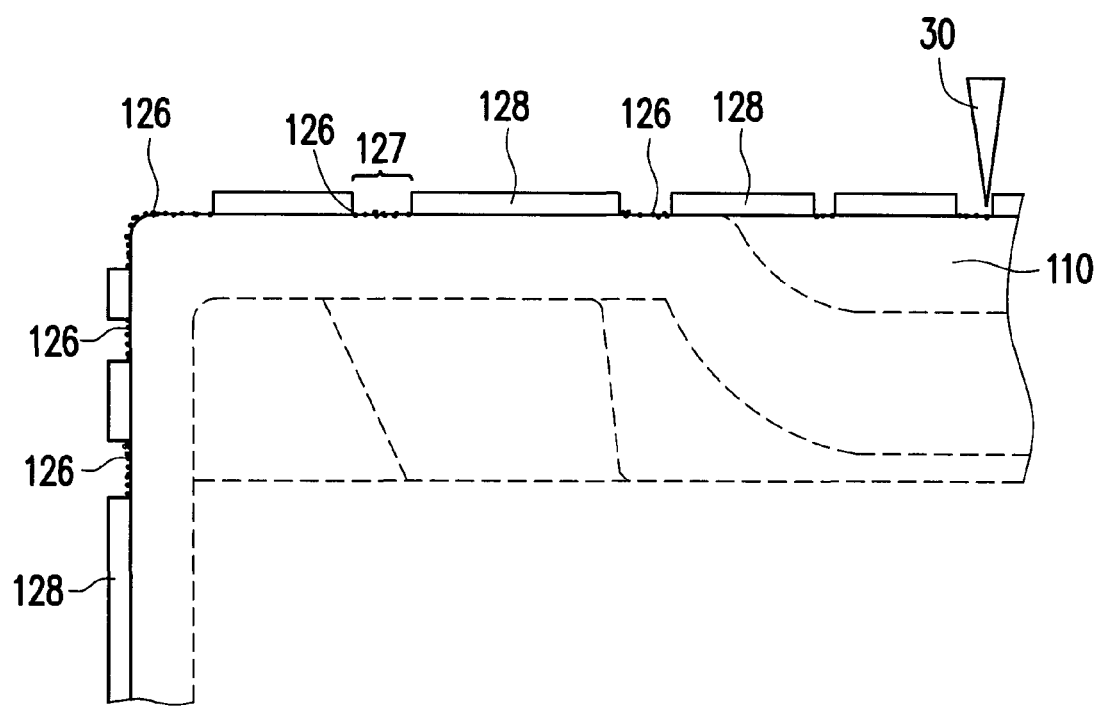

Referring to FIG. 3, a laser process 30 is performed to treat a portion of the mixture layer 120 to form active seed residues 126. The active seed residues 126 may be conductive or non-conductive residues. In principles, the active seed residues 126 are almost uniformly distributed over the region of the treated portion 127 of the mixture layer 120. The distribution range of the active seed residues 126 (i.e. the position of the treated portion 127) corresponds the position of the metallic pattern to be formed in the subsequent process. The type of the laser used in the laser process depends on the type and size of the nanoparticles 122 within the mixture layer 120. For treating the copper oxide nanoparticles, the laser used in the laser process 30 may be a ultraviolet (UV) laser at 355 nm with a power of 0.2~0.4 W and 80% overlapping of laser spots for example. Alternatively, an infrared (IR) laser at 1064 nm with a power of 3 W and 75% overlapping of laser spots may be used. For treating the silver nanoparticles, the laser used in the laser process 30 may be a green light laser at 532 nm or an IR laser at 1064 nm, for example. Basically, the intensity of the laser may be relatively lower due to high surface area and absorption of the nanoparticles through surface plasmon resonance effect. For example, the laser process 30 is a laser ablation and activation process.

Upon laser illumination, nanoparticles, especially metal or metallic nanoparticles, efficiently generate heat (release heat) and the released heat transfers from the nanoparticles to the surrounding matrix or medium. The heating effect of the nanoparticles becomes strongly enhanced under plasmon resonance or when the laser frequency hits the collective resonance of the nanoparticle.

Taking advantages of the heating effect enhanced under plasmon resonance, the nanoparticles 122 in the treated portion of the mixture layer 120 are fused and turned into the active seed residues 126 during the laser process 30 and the active seed residues 126 are tightly fixed to the surface 110a. As the content of the nanoparticles 122 is merely about 10 wt %~20 wt % and the nanoparticles 122 are not densely dispersed in the mixture layer 120, the obtained active seed residues 126 are not crowdedly formed together. Using the nanoparticles made of copper oxide as an example, the active seed residues 126 may be discontinuous copper residues distributed over the region of the treated portion 127. The active seed residues 126 distributed in a pattern can function as the seed pattern for the subsequent electroless plating process. Because the formation of the active seed residues 126 is activated by laser, the location and the shape of the pattern can be precisely controlled.

Figure 4:
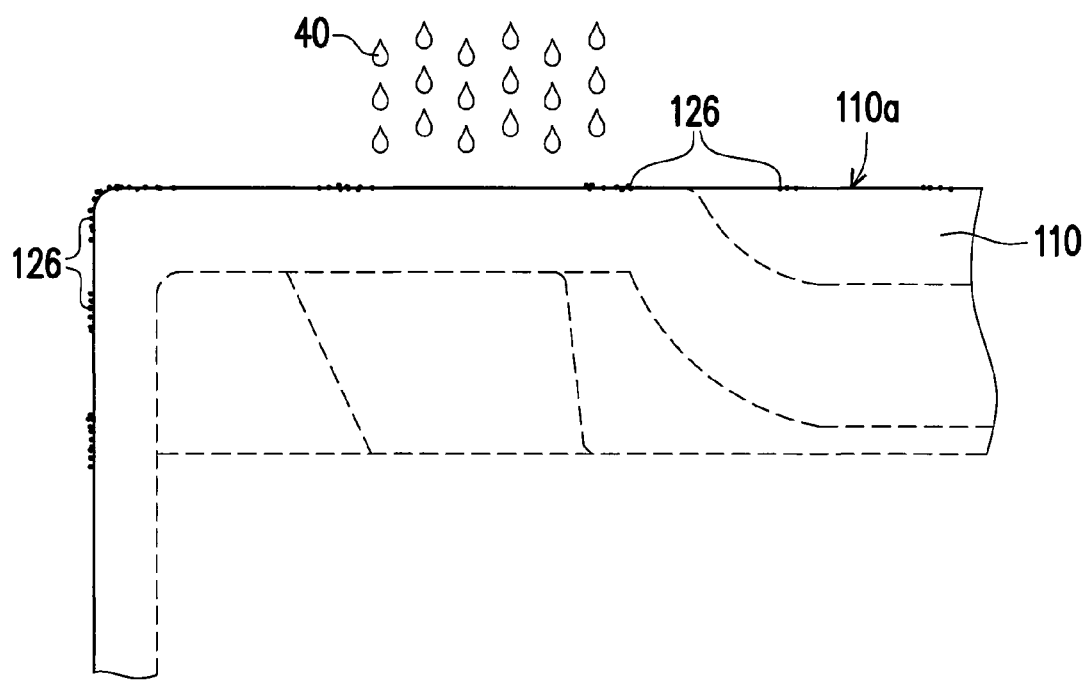

Referring to FIG. 4, after the laser process 30, a cleaning process 40 is performed to remove the untreated portion 128 (see FIG. 3) of the mixture layer 120 to expose the surface 110a of the polymer substrate 110, while the active seed residues 126 are remained on the surface 110a of the polymer substrate 110. The solvent used in the cleaning process may be water, acetone or suitable alcohols, for example.

Figure 5:
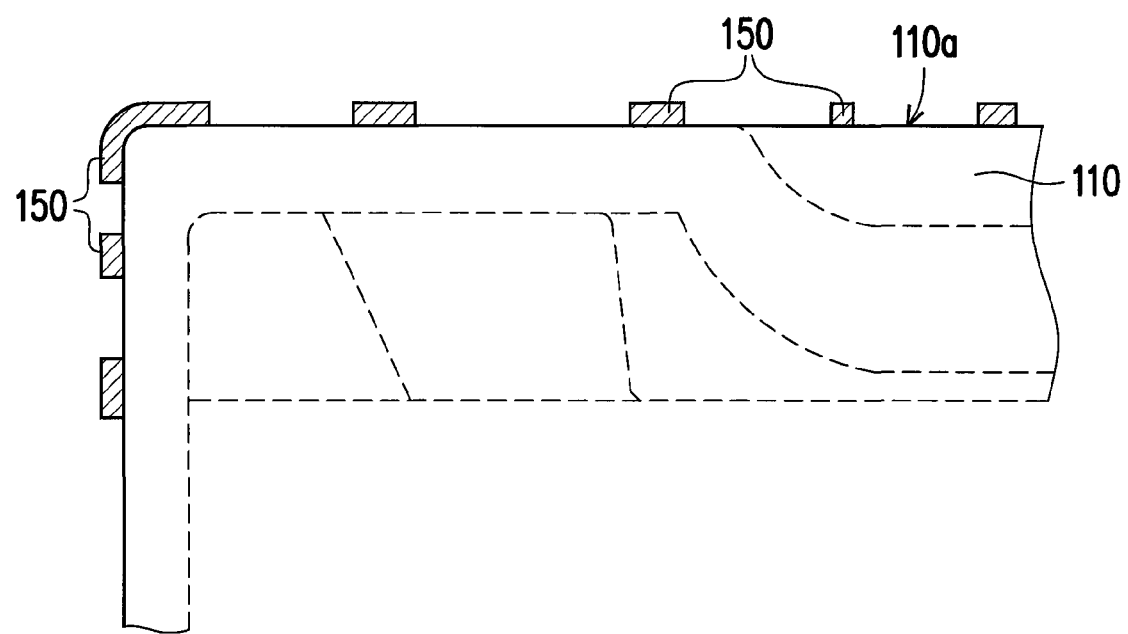

Referring to FIG. 5, the polymer substrate 110 and the active seed residues 126 remained on the surface 110a of the polymer substrate 110 are further processed with an electroless plating process to form a metallic pattern 150. As the active seed residues 126 functions as the seed pattern for electroless plating, the metallic pattern 150 is formed exactly on the distribution region of the active seed residues 126. The distribution density of the active seed residues 126 can be controlled by adjusting the content of the nanoparticles in the mixture layer. In general, the distribution density of the active seed residues 126 may be closely packed enough to form a thin layer as the metallic pattern. However, it is not necessary for the active seed residues 126 to form an integral thin layer, as long as the active seed residues 126 stay close to one another and maintain a pattern for the subsequent electroless plating process. The metallic pattern 150 may have a thickness no more than 20 microns, for example. No electroless plating occurs to the exposed polymer surface 110a corresponding to the untreated portion 128. The active seed residues 126 can be easily incorporated into the metallic pattern 150 during the electroless plating process and both may be viewed as an integral body. For example, the active seed residues 126 may be copper residues, the electroless plating process may be an electroless copper plating process and the metallic pattern 150 may be a copper pattern. The metallic pattern 150 may be composed of a continuous pattern or discontinuous patterns. Also, since the distribution location and the shape of the active seed residues 126 can be precisely controlled, the pattern fidelity of the metallic pattern 150 is high. By using laser, the obtained metallic pattern can have a very precise pattern outline. Also, as the scanning of laser is adaptable to the topography or configuration of the substrate, the metallic pattern can be formed on a planar surface or over a non-planar object.

The polymer substrate 110 may be a part or parts of an electronic device, such as a smart phone or a tablet PC, and the metallic pattern 150 may be an antenna part or a three-dimensional circuit incorporated within the electronic device. The polymer substrate and the metallic pattern formed thereon may be an injection-molded thermoplastic part with integrated electronic circuit traces, for example. The manufacturing method of the present invention may be applied to produce a molded interconnect device (MID), or parts (such as handset antenna or 3D electronic circuitry) of electronic products in the fields of consumer electronics, telecommunication, automobiles and/or medical instruments.

Compared with the prior laser direct structuring (LDS) technology, the manufacturing method of the present invention can be applied to any suitable polymer substrate to form the metallic pattern and there is no need to use LDS-specific polymer material(s), which are more expensive and with high color dependency. By using the manufacturing method of the present invention, nanoparticles of lower costs (e.g. copper oxide nanoparticles) may be used and the amount of nanoparticles needed for forming the metallic pattern of a minimum thickness is little. By using laser, the obtained metallic pattern can have a very precise pattern layout and can be formed on a planar surface or over a non-planar contour.

By using the manufacturing method of the present invention, the production costs may be lower and the flexibility of processing becomes higher for more choices in the substrate materials. Also, high quality products may be manufactured by providing products with high pattern fidelity and less color dependency of the substrate.

The manufacturing method described in the embodiments can be equitably applied to form the circuits, wirings or metallic parts for portable electronic devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a metallic pattern on a polymer substrate, comprising:

providing a polymer substrate;

forming a mixture layer on a surface of the polymer substrate, wherein the mixture layer includes an active carrier medium and nanoparticles dispersed in the active carrier medium, and a material of the nanoparticles includes copper oxide;

performing a laser process to treat a portion of the mixture layer to form active seed residues on the surface of the polymer substrate, wherein the laser process is performed by using a UV laser at 355 nm with a power of 0.2~0.4 W and 80% overlapping and the laser process is a laser ablation and activation process;

performing a cleaning process to remove an untreated portion of the mixture layer to expose the surface of the polymer substrate, while the active seed residues are remained on the surface of the polymer substrate; and subjecting the active seed residues on the polymer substrate to an electroless plating process to form the metallic pattern over the active seed residues.

2. The method according to claim 1, wherein a material of the polymer substrate includes nylons, polycarbonates (PC), acrylonitrile butadiene styrene (ABS), PC/ABS, polyethylene terephthalate (PET), polyether ether ketone (PEEK) or liquid crystal polymers (LCP).

3. The method according to claim 1, wherein the active seed residues are copper residues.

4. The method according to claim 1, wherein the electroless plating process includes an electroless copper plating process and the metallic pattern includes a copper pattern.

5. The method according to claim 1, wherein the nanoparticles have an average size below 100 nm.

6. The method according to claim 1, wherein a content of the nanoparticles in the mixture layer ranges from 10 wt % to 20 wt %, relative to a total weight of the mixture layer.

7. The method according to claim 1, wherein a material of the active carrier medium includes polyvinylpyrrolidone (PVP) or polyethylene oxide (PEO).

8. The method according to claim 1, wherein forming the mixture layer includes forming the mixture layer by spraying, spin coating, dip coating, screen printing, pad printing or smearing.

9. The method according to claim 1, wherein a position of a distribution range of the active seed residues corresponds to a position of the metallic pattern.

* * * * *